(12) United States Patent
Koujima et al.

(10) Patent No.: US 9,397,401 B2
(45) Date of Patent: Jul. 19, 2016

(54) MAGNETIC ANTENNA, BOARD MOUNTED WITH THE SAME, AND RF TAG

(75) Inventors: Jun Koujima, Hiroshima-ken (JP); Tetsuya Kimura, Hiroshima-ken (JP); Takanori Doi, Hiroshima-ken (JP); Yoshiro Sato, Tokyo (JP)

(73) Assignee: TODA KOGYO CORPORATION, Hiroshima-shi, Hiroshima-ken (JP)

( * ) Notice: Subject to any disclaimer, the term of this patent is extended or adjusted under 35 U.S.C. 154(b) by 1150 days.

(21) Appl. No.: 12/989,162

(22) PCT Filed: Apr. 22, 2009

(86) PCT No.: PCT/JP2009/001851
§ 371 (c)(1),
(2), (4) Date: Dec. 27, 2010

(87) PCT Pub. No.: WO2009/130901
PCT Pub. Date: Oct. 29, 2009

(65) Prior Publication Data
US 2011/0124299 A1 May 26, 2011

(30) Foreign Application Priority Data

Apr. 25, 2008 (JP) ................................. 2008-116334

(51) Int. Cl.
*H01Q 7/08* (2006.01)
*G06K 19/077* (2006.01)
(Continued)

(52) U.S. Cl.
CPC ............ *H01Q 7/08* (2013.01); *G06K 19/07749* (2013.01); *G06K 19/07771* (2013.01);
(Continued)

(58) Field of Classification Search
USPC ............................ 343/702, 700 MS, 787, 788
See application file for complete search history.

(56) References Cited

U.S. PATENT DOCUMENTS 2,973,516 A * 2/1961 Medved .................... H01P 1/32
343/753
4,879,570 A * 11/1989 Takizawa ............. H01Q 1/3291
343/713
(Continued)

FOREIGN PATENT DOCUMENTS

JP 5-267922 10/1993
JP 7-221533 8/1995
(Continued)

OTHER PUBLICATIONS

International Search Report for PCT/JP2009/001851, mailed Jul. 14, 2009.
(Continued)

*Primary Examiner* — Hoang V Nguyen
*Assistant Examiner* — Hai Tran
(74) *Attorney, Agent, or Firm* — Nixon & Vanderhye P.C.

(57) ABSTRACT

The present invention relates to a magnetic antenna for information communication using a magnetic field component which is capable of satisfying both reduction in size and improvement in communication sensitivity. The magnetic antenna of the present invention is used for transmitting and receiving information using an electromagnetic induction method, and comprises a central core formed of a magnetic material and a non-magnetic material, a coil-shaped electrode material wound around the core, and an insulating layer formed on at least one outside surface of the core on which the coil-shaped electrode material is provided, in which the magnetic material is separated into two or more parts through the non-magnetic material when viewed in a section of the core which is perpendicular to a magnetic flux passing therethrough.

18 Claims, 8 Drawing Sheets

(51) Int. Cl.
*H01F 1/34* (2006.01)
*H01Q 1/40* (2006.01)
*H05K 1/16* (2006.01)
*H01F 41/16* (2006.01)

(52) U.S. Cl.
CPC ............... *H01F1/344* (2013.01); *H01Q 1/40* (2013.01); *H05K 1/165* (2013.01); *H01F 41/16* (2013.01); *H05K 2203/162* (2013.01)

(56) References Cited

U.S. PATENT DOCUMENTS 5,870,065 A * 2/1999 Kanba ................. H01Q 1/38 343/787
7,088,304 B2 * 8/2006 Endo ................. G06K 19/0726 343/788
7,098,858 B2 * 8/2006 Bittar ................. H01Q 1/04 324/338
2005/0206574 A1 * 9/2005 Okayama ................. H01Q 1/36 343/788
2008/0129629 A1 6/2008 Kimura et al.
2010/0182144 A1 7/2010 Yamashita et al.

FOREIGN PATENT DOCUMENTS

| | | |
|---|---|---|
| JP | 2003-110340 | 4/2003 |
| JP | 2003-218626 | 7/2003 |
| JP | 2004-363162 | 12/2004 |
| JP | 2005-006263 | 1/2005 |
| WO | 2007/007639 | 1/2007 |

OTHER PUBLICATIONS

JP Office Action and English language translation in JP 2009-106880 mailed Apr. 17, 2013.

* cited by examiner

MAGNETIC ANTENNA, BOARD MOUNTED WITH THE SAME, AND RF TAG

This application is the U.S. national phase of International Application No. PCT/JP2009/001851, filed 22 Apr. 2009, which designated the U.S. and claims priority to Japanese Patent Application No. 2008-116334, filed 25 Apr. 2008, the entire contents of each of which are hereby incorporated by reference.

TECHNICAL FIELD

The present invention relates to a magnetic antenna for information communication using a magnetic field component, and more particularly, to a magnetic antenna which is capable of not only satisfying both reduction in size and improvement in communication sensitivity, but also transmitting and receiving a signal with a high sensitivity even when attached to a metal object without suffering from significant influences thereof.

BACKGROUND ART

An antenna for transmitting and receiving an electromagnetic wave using a magnetic material (hereinafter referred to merely as a "magnetic antenna"), in which a magnetic field component coming from the outside is allowed to pass through the core (magnetic material), around which a coil of a conductive wire is wound, to convert the magnetic field component into a voltage (or current) induced by the coil, has been widely used in small sized radios and TVs. Such a magnetic antenna is also used in a non-contact object identification device called RF tag which has recently come into use.

To transmit and receive an electromagnetic wave with a higher frequency, a loop antenna free of a magnetic material and including a loop coil having a coil surface parallel to an object to be identified is used in RF tags. When the frequency is much higher (UHF band or microwave band), an electric field antenna (dipole antenna or dielectric antenna) for detecting an electric field component instead of a magnetic field component is widely used in such RF tags.

However, the loop antenna and electric field antenna have the following problems. That is, when such an antenna comes close to a metallic object, an image (mirror effect) is generated on the metallic object. Since the magnetic field of the image has a phase opposite to that of the antenna, the sensitivity of the antenna tends to be lost.

On the other hand, there is also known a magnetic antenna for transmitting and receiving a magnetic component which comprises a magnetic layer as a central core, an coil-shaped electrode material wound on the core, an insulating layer formed on at least one outside surface of the core on which the coil-shaped electrode material is provided, and a conductive layer formed on at least one outside surface of the insulating layer (Patent Document 1). The magnetic antenna described in Patent Document 1 can maintain properties required for antennas even when coming into contact with metallic objects.

Also, it is known that a core for antennas comprises a magnetic material and a non-magnetic material such as resins (Patent Documents 2 to 4).

Patent Document 1: Japanese Patent Application Laid-open (KOKAI) No. 2007-19891

Patent Document 2: Japanese Patent Application Laid-open (KOKAI) No. 6-59046

Patent Document 3: Japanese Patent Application Laid-open (KOKAI) No. 2003-110340

Patent Document 4: Japanese Patent Application Laid-open (KOKAI) No. 2003-283231

DISCLOSURE OF THE INVENTION

Problem to be Solved by the Invention

In the method described in Patent Document 1, it may be difficult to satisfy both reduction in size and a sufficient sensitivity in the case where a longer communication distance is required.

Also, in the methods described in Patent Documents 2 to 4, since the magnetic layer is divided into plural parts by using a resin material incapable of withstanding a high-temperature production process, it may be impossible to use a soft magnetic ferrite having a high sintering density therein. In addition, in these methods, it may be difficult to produce a magnetic core or a magnetic antenna by a lamination method using an LTCC technology.

Under these circumstances, an object of the present invention is to provide a magnetic antenna which can maintain excellent properties for antennas even when coming into contact with metallic objects, can be prevented from suffering from adverse influence of a demagnetizing field even in a limited size to enhance an effective magnetic permeability of a magnetic core thereof, can be further enhanced in sensitivity, and can thereby realize a further reduction in size.

Means for Solving the Problem

The above object of the present invention can be achieved by the following aspects of the present invention.

That is, in accordance with the present invention, there is provided a magnetic antenna for transmitting and receiving information using an electromagnetic induction method, comprising a central core formed of a magnetic material and a non-magnetic material, a coil-shaped electrode material wound around the core, and an insulating layer formed on at least one outside surface of the core on which the coil-shaped electrode material is provided, in which the magnetic material is separated into two or more parts through the non-magnetic material when viewed in a section of the core which is perpendicular to a magnetic flux passing therethrough (Invention 1).

In addition, according to the present invention, there is provided a magnetic antenna for transmitting and receiving information using an electromagnetic induction method, comprising a central core formed of a magnetic material and a non-magnetic material, a coil-shaped electrode material wound around the core, an insulating layer formed on at least one outside surface of the core on which the coil-shaped electrode material is provided, or along an outer periphery of the core, and a conductive layer formed on at least one outside surface of the insulating layer, in which the magnetic material is separated into two or more parts through the non-magnetic material when viewed in a section of the core which is perpendicular to a magnetic flux passing therethrough (Invention 2).

Also, according to the present invention, there is provided a magnetic antenna as described in the above Invention 1 or 2, wherein the non-magnetic material is formed of a non-magnetic ferrite and/or a glass-based ceramic material (Invention 3).

Also, according to the present invention, there is provided a magnetic antenna as described in any one of the above Inventions 1 to 3, wherein the core is formed by laminating the magnetic material and the non-magnetic material (Invention 4).

Also, according to the present invention, there is provided a magnetic antenna as described in any one of the above Inventions 1 to 3, wherein the magnetic material and the non-magnetic material are formed into a lattice structure when viewed in a section of the core (Invention 5).

Also, according to the present invention, there is provided a magnetic antenna as described in any one of the above Inventions 1 to 3, wherein the non-magnetic material is disposed outside of each of a plurality of circular portions formed of the magnetic material when viewed in a section of the core (Invention 6).

Also, according to the present invention, there is provided a magnetic antenna as described in any one of the above Inventions 1 to 6, wherein an area ratio of all portions of the magnetic material to all portions of the non-magnetic material is not more than 1.0 when viewed in a section of the core (Invention 7).

Further, according to the present invention, there is provided a board comprising the magnetic antenna as described in any one of the above Inventions 1 to 7 which is mounted thereon (Invention 8).

Furthermore, according to the present invention, there is provided a communication device comprising the magnetic antenna as described in any one of the above Inventions 1 to 7 which is mounted thereon (Invention 9).

In addition, according to the present invention, there is provided an RF tag comprising the magnetic antenna as described in any one of the above Inventions 1 to 7 which is mounted together with IC thereon (Invention 10).

Effect of the Invention

The magnetic antenna of the present invention has a further enhanced sensitivity, can be used for a longer distance communication, and undergoes a less change in communication sensitivity even when coming close to and into contact with metallic objects. Therefore, the magnetic antenna can be suitably used in the applications such as 13.56 MHz RFID.

The magnetic antenna of the present invention has a small size and a high communication sensitivity and, therefore, can be suitably used in various applications such as various portable equipments, containers, metal parts, boards, metal tools and metal molds without any particular limitations to an installation space therefor.

EXPLANATION OF REFERENCE NUMERALS

1: through-hole; 2: electrode layer (coil electrode); 3: coil open end; 4: coil; 5: magnetic layer; 6: insulating layer; 7: conductive layer; 8: non-magnetic layer; 9: IC connecting electrode layer; 10: IC; 11: capacitor electrode; 12: capacitor; 13: direction of line of magnetic force; 14: board connecting electrode layer; 15: board Preferred Embodiment for Carrying Out the Invention The magnetic antenna of the present invention is described below.

Figure 1:
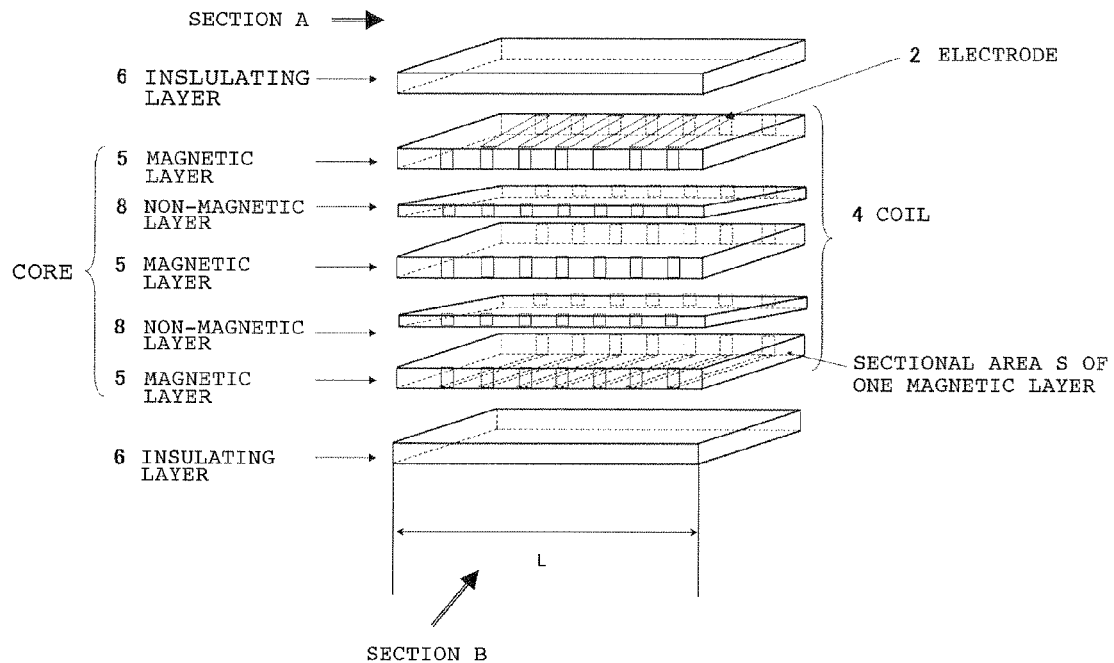
FIG. 1 is a perspective view showing a magnetic antenna according to the present invention.
Figure 5:
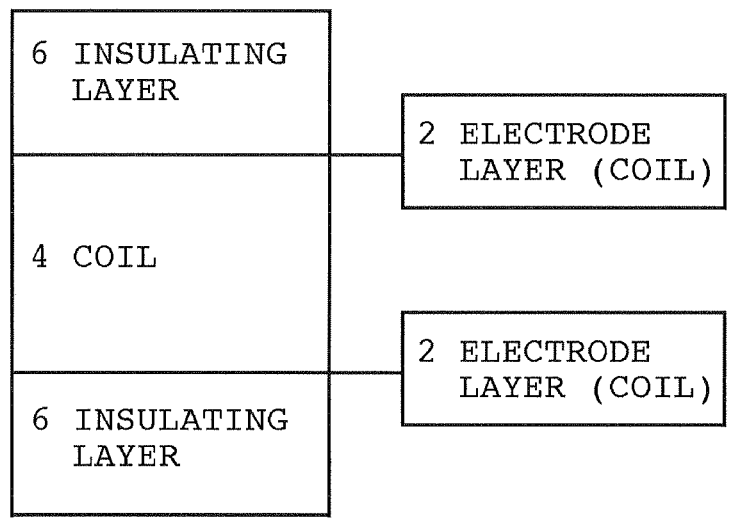
FIG. 5 is a conceptual view showing a laminated structure of a magnetic antenna according to the present invention.

In FIGS. 1 and 5, there are shown schematic views of the magnetic antenna according to the present invention. As shown in FIG. 1, the magnetic antenna according to the present invention has a basic structure which comprises a central core formed of a magnetic material (5) and a non-magnetic material (8), a coil-shaped (wire winding-shaped) electrode material disposed outside of the core, and an insulating layer formed on at least one surface of the core on which the coil-shaped electrode material is provided. The core has such a structure that the magnetic material is separated into two or more parts by the non-magnetic material.

Figure 2:
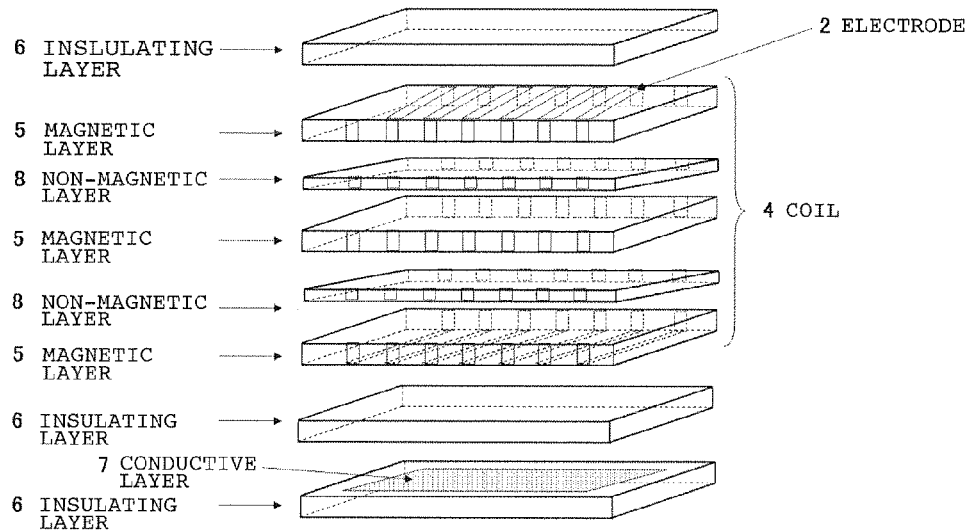
FIG. 2 is a perspective view showing a magnetic antenna according to the present invention.
Figure 6:
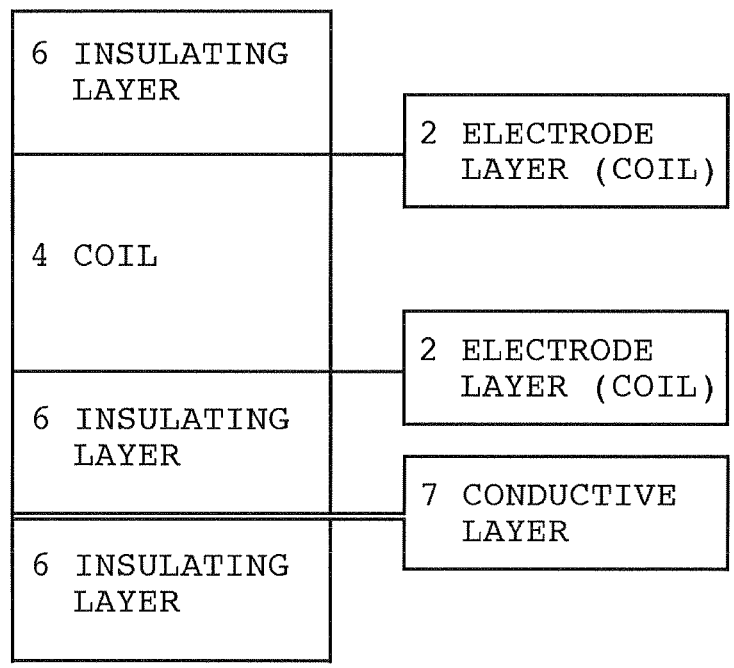
FIG. 6 is a conceptual view showing a laminated structure of a magnetic antenna according to the present invention.

As shown in FIGS. 2 and 6, the magnetic antenna according to the present invention may also have a basic structure which comprises a central core formed of a magnetic material (5) and a non-magnetic material (8), a coil-shaped (wire winding-shaped) electrode material disposed outside of the core, an insulating layer formed on at least one outside surface of the core on which the coil-shaped electrode material is provided, and a conductive layer (7) formed on at least one outside surface of the insulating layer. The magnetic antenna comprising the conductive layer exhibits a less change in properties even when any metallic objects come close thereto and, therefore, has a less change in resonance frequency.

The core of the magnetic antenna according to the present invention may be formed into any configuration as long as the magnetic material is divided into plural parts through the non-magnetic material when viewed in a section of the core of the magnetic antenna which is cut in the direction perpendicular to that of a magnetic flux passing through the magnetic antenna. For example, the core of the magnetic antenna may be formed into such configurations as shown in FIGS. 3(*a*) to 3(*d*).

Figure 3:
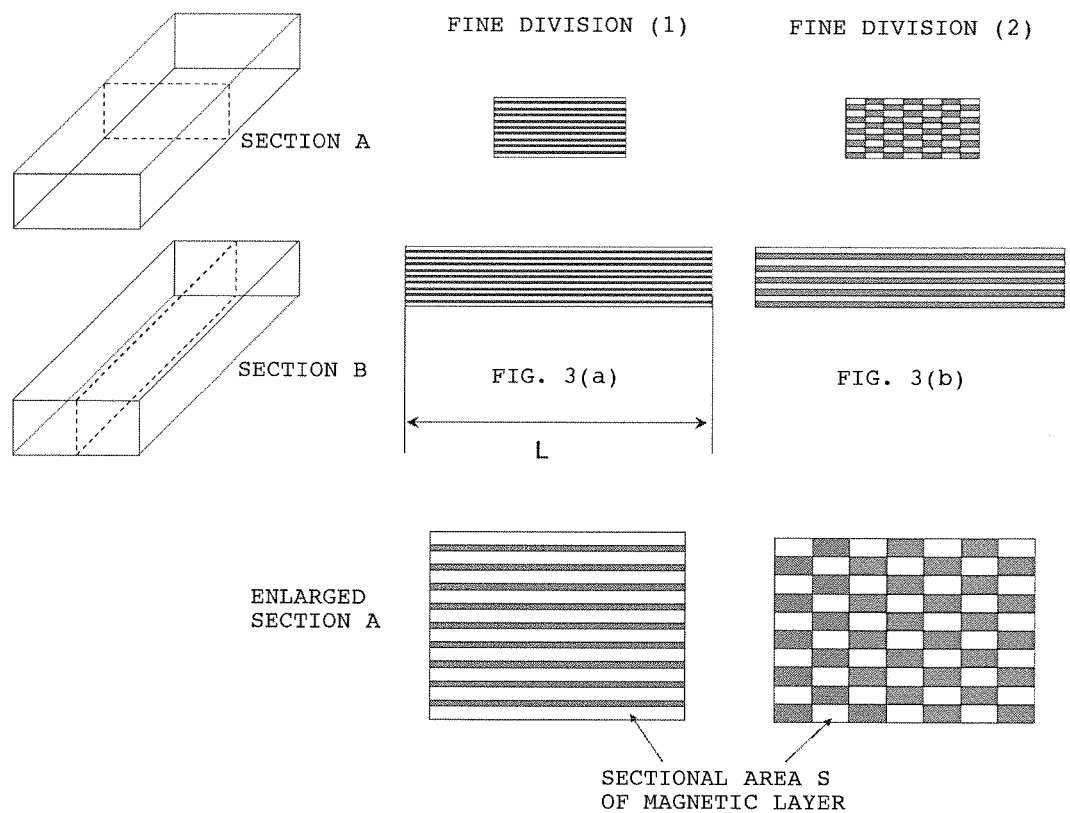
FIG. 3 is a conceptual view showing a configuration of a core used in the present invention.
Figure 3:
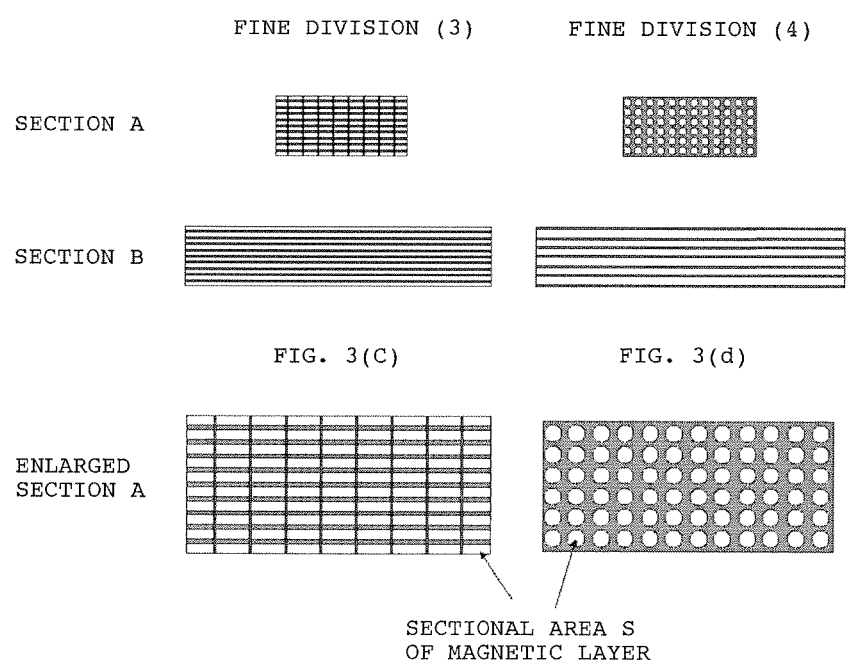

FIGS. 3(*a*) to 3(*d*) are conceptual views each showing a configuration of the core. In FIGS. 3(*a*) to 3(*d*), the section A is a section of the magnetic antenna when viewed from the direction of the section A in FIG. 1. Also, the section B is a section of the magnetic antenna when viewed from the direction of the section B in FIG. 1.

In the magnetic antenna of the present invention, the core may have a laminated structure which is formed by laminating magnetic layers and non-magnetic layers on each other. For example, the core may have such a laminated structure as shown in FIG. 3(a).

In this case, the ratio of the thickness of one magnetic layer to the thickness of one non-magnetic layer is preferably not more than 1.0. When the thickness of the non-magnetic layer is too large, the content of the magnetic material in the core is reduced, which tends to be disadvantageous for achieving reduction in size of the magnetic antenna. The ratio of the thickness of one magnetic layer to the thickness of one non-magnetic layer in the core is more preferably not more than 0.5, and still more preferably not more than 0.2.

In the magnetic antenna of the present invention, as shown in FIG. 3(b), the section of the core may has a lattice structure in which the magnetic layers and the non-magnetic layers are disposed in a lattice form.

In the magnetic antenna of the present invention, as shown in FIG. 3(c), the section of the core may have such a structure in which the magnetic layers are separated by the respective non-magnetic layers not only in the lateral direction but also in the longitudinal direction.

In the magnetic antenna of the present invention, as shown in FIG. 3(d), the section of the core may have such a structure in which a plurality of the bar-like portions of the magnetic material are disposed at equal intervals in the non-magnetic material.

In the magnetic antenna of the present invention, the area ratio of all portions of the magnetic material to all portions of the non-magnetic material (all portions of the magnetic material/all portions of the non-magnetic material) as measured on the section of the core is preferably not more than 1.0. When the area ratio of the portions formed of the non-magnetic material exceeds the above-specified range, the content of the magnetic material in the core is reduced, which tends to be disadvantageous for achieving reduction in size of the magnetic antenna. The area ratio of all portions of the magnetic material to all portions of the non-magnetic material is more preferably not more than 0.5, and still more preferably not more than 0.2.

In the magnetic antenna of the present invention, the ratio of a sectional area (S) of one of the magnetic layers forming the core of the magnetic antenna as shown in FIG. 1 to a length (L) of the magnetic antenna (S/L) is preferably not more than 0.3. When the area ratio (S/L) is more than 0.3, it may be difficult to reduce adverse influences owing to a demagnetizing field.

In the magnetic antenna of the present invention, as the magnetic material of the core, there may be used Ni—Zn-based ferrite, etc. The Ni—Zn-based ferrite used in the present invention preferably has a composition comprising 45 to 49.5 mol % of $Fe_2O_3$, 9.0 to 45.0 mol % of NiO, 0.5 to 35.0 mol % of ZnO and 4.5 to 15.0 mol % of CuO. The ferrite composition may be suitably selected such that the resulting core has a high magnetic permeability and a low magnetic loss in a frequency band to be used. When using a material having a excessively high magnetic permeability as the magnetic material, the resulting core tends to undergo an increased magnetic loss and as a result, tends to be unsuitable for antennas.

For example, the ferrite composition is preferably selected such that the core has a magnetic permeability of 70 to 120 at 13.56 MHz when the magnetic antenna is applied to an RFID tag, and has a magnetic permeability of 10 to 30 at 100 MHz when the magnetic antenna is used to receive commercial FM broadcasts, because the magnetic loss can be reduced.

In the magnetic antenna of the present invention, as the non-magnetic material of the core, there may be used non-magnetic ferrites such as Zn-based ferrite, glass-based ceramic materials such as borosilicate glass, zinc glass and lead glass, or mixtures comprising the non-magnetic ferrite and the glass-based ceramic material at an adequate mixing ratio.

The ferrite powder used as the non-magnetic ferrite may be selected so as to have such a Zn-based ferrite composition that a sintered body of the ferrite powder has a volume resistivity of not less than $10^8$ Ω·cm. The Zn-based ferrite composition preferably comprises 45 to 49.5 mol % of $Fe_2O_3$, 17.0 to 22.0 mol % of ZnO and 4.5 to 15.0 mol % of CuO.

The glass-based ceramic powder used as the glass-based ceramic material may be selected so as to have such a composition that its linear expansion coefficient is not largely different from that of the magnetic material used. More specifically, the composition is preferably selected such that the difference in linear expansion coefficient between the glass-based ceramic powder and a soft magnetic ferrite used as the magnetic material lies within the range of ±5 ppm/° C.

The magnetic antenna having such a core as shown in FIG. 3(a) according to the present invention may be produced, for example, by the following method.

First, a mixture prepared by mixing magnetic particles and a binder is formed into a sheet shape to form a single magnetic layer or a plurality of magnetic layers which are laminated together.

Separately, a mixture prepared by mixing non-magnetic particles and a binder is formed into a sheet shape to form a single non-magnetic layer or a plurality of non-magnetic layers which are laminated together.

Figure 4:
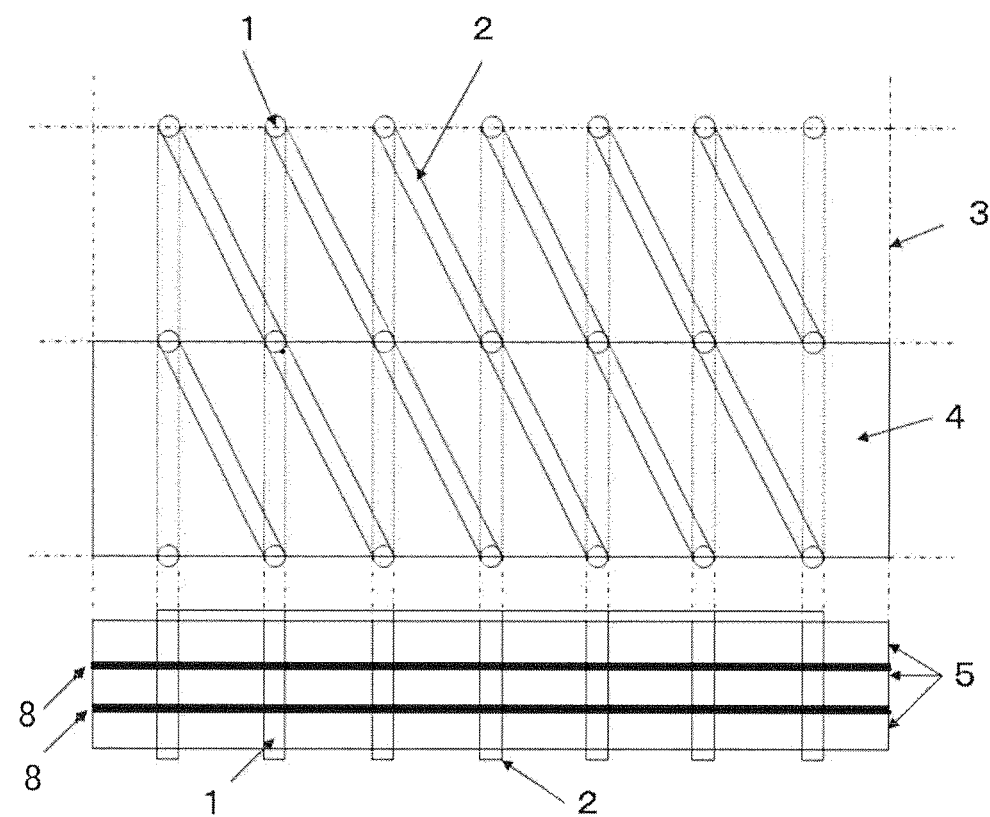
FIG. 4 is a view showing a laminated structure of a coil portion in a magnetic antenna according to the present invention.

Next, as shown in FIG. 4, the magnetic layers (5) and the non-magnetic layers (8) are alternately laminated to obtain a laminate having a desired total thickness.

Then, a desired number of through-holes (1) are formed through the thus obtained laminate comprising the magnetic layers and the non-magnetic layers. The electrode material is poured into the respective through-holes. Also, the electrode material is applied on both surfaces of the laminate which are perpendicular to the through-holes, to form an electrode layer (2) in the form of a coil (wire winding) which is connected with the electrode material poured into the through-holes. The electrode material poured into the through-holes and the electrode layer cooperate so as to form a coil around a rectangular core constituted from the magnetic layers. In this case, there is obtained such a construction in which both terminal ends of the magnetic layers constituting the core are open ends of a magnetic circuit (refer to numeral 3 in FIG. 4).

Next, as shown in FIG. 1 or FIG. 5, insulating layers (6) are respectively formed on upper and lower surfaces of the coil on which the electrode layer is provided.

The thus obtained sheet is cut into a desired shape along the through-holes and the open ends of the coil and then integrally sintered, or is integrally sintered and then cut into a desired shape along the through-holes and the open ends of the coil, thereby producing the magnetic antenna (LTCC technology).

Also, the magnetic antenna having such a core as shown in FIG. 3(b) according to the present invention may be produced, for example, by the following method.

First, a mixture prepared by mixing magnetic particles and a binder is formed into a sheet shape to form a single magnetic layer or a plurality of magnetic layers which are laminated together.

Separately, a mixture prepared by mixing non-magnetic particles and a binder is formed into a sheet shape to form a single non-magnetic layer or a plurality of non-magnetic layers which are laminated together.

The thus obtained sheets for the magnetic layers and the non-magnetic layers are cut into a desired width using a cutting machine for ceramic green sheet laminates.

The thus cut sheets are alternately placed side by side in the order of the magnetic layer and the non-magnetic layer in the form of one sheet having an adequate size suitable for the subsequent step for producing a laminate, and then pressed and bonded together.

The above cut sheets are also alternately stacked on one another in the vertical direction in the order of the magnetic layer and the non-magnetic layer to form a laminate comprising the magnetic layers and the non-magnetic layers which respectively have a desired thickness.

Subsequently, similarly to the previous method, formation of the through-holes, pouring of the electrode material thereinto and formation of the coil-shaped electrode layer, formation of the insulating layer, and cutting/sintering or sintering/cutting, are successively performed to produce the magnetic antenna.

Also, the magnetic antenna having such a core as shown in FIG. 3(c) according to the present invention may be produced, for example, by the following method.

First, a mixture prepared by mixing magnetic particles and a binder is formed into a sheet shape to form a single magnetic layer or a plurality of magnetic layers which are laminated together.

The thus obtained sheets for the magnetic layers and the non-magnetic layers are cut into a desired width using a cutting machine for ceramic green sheet laminates.

The thus cut sheets are alternately placed side by side in the order of the magnetic layer and the non-magnetic layer in the form of one sheet having an adequate size suitable for the subsequent step for producing a laminate, and then pressed and bonded together.

The thus obtained sheets and the uncut non-magnetic layer sheets are alternately laminated to form a laminate comprising the magnetic layers and the non-magnetic layers which respectively have a desired thickness.

Subsequently, similarly to the previous methods, formation of the through-holes, pouring of the electrode material thereinto and formation of the coil-shaped electrode layer, formation of the insulating layer, and cutting/calcination or calcination/cutting, are successively performed to produce the magnetic antenna.

Further, the magnetic antenna having such a core as shown in FIG. 3(d) according to the present invention may be produced, for example, by the following method.

First, a mixture prepared by mixing magnetic particles and a binder is formed into a bar shape having a desired size. The thus obtained magnetic bars are put in a row on a dish-shaped container at equal intervals, and then a mixture prepared by mixing non-magnetic particles and a binder is poured into the container to form a sheet.

The thus obtained magnetic sheets and non-magnetic sheets are laminated such that each non-magnetic sheet is sandwiched between the magnetic sheets, thereby forming a laminate having a desired thickness.

Subsequently, similarly to the previous methods, formation of the through-holes, pouring of the electrode material thereinto and formation of the coil-shaped electrode layer, formation of the insulating layer, and cutting/calcination or calcination/cutting, are successively performed to produce the magnetic antenna.

In addition, the magnetic antennas as shown in FIGS. 2 and 6 according to the present invention may be produced, for example, by the following method.

First, a mixture prepared by mixing magnetic particles and a binder is formed into a sheet shape to form a single magnetic layer or a plurality of magnetic layers which are laminated together.

Separately, a mixture prepared by mixing non-magnetic particles and a binder is formed into a sheet shape to form a single non-magnetic layer or a plurality of non-magnetic layers which are laminated together.

Next, as shown in FIG. 4, the magnetic layers (5) and the non-magnetic layers (8) are alternately laminated to obtain a laminate having a desired total thickness.

Then, a desired number of through-holes (1) are formed through the thus obtained laminate comprising the magnetic layers and the non-magnetic layers. The electrode material is poured into the respective through-holes (1). Also, the electrode material is applied on both surfaces of the laminate which are perpendicular to the through-holes, to form an electrode layer (2) in the form of a coil (wire winding) which is connected with the electrode material poured into the through-holes. The electrode material poured into the through-holes and the electrode layer cooperate so as to form a coil around a rectangular core constituted from the magnetic layers. In this case, there is obtained such a construction in which both terminal ends of the magnetic layers forming the coil are open ends of a magnetic circuit.

Next, as shown in FIG. 2, insulating layers (6) are respectively formed on upper and lower surfaces of the coil on which the electrode layer is provided.

Further, a conductive layer (7) is formed on at least one upper surface (outside surface) of the respective insulating layers.

The thus obtained sheet is cut into a desired shape along the through-holes and the open ends of the coil and then integrally sintered, or is integrally sintered and then cut into a desired shape along the through-holes and the open ends of the coil, thereby producing the magnetic antenna (LTCC technology).

Meanwhile, if required, the conductive layer may be formed along an entire outer periphery of the coil.

Figure 7:
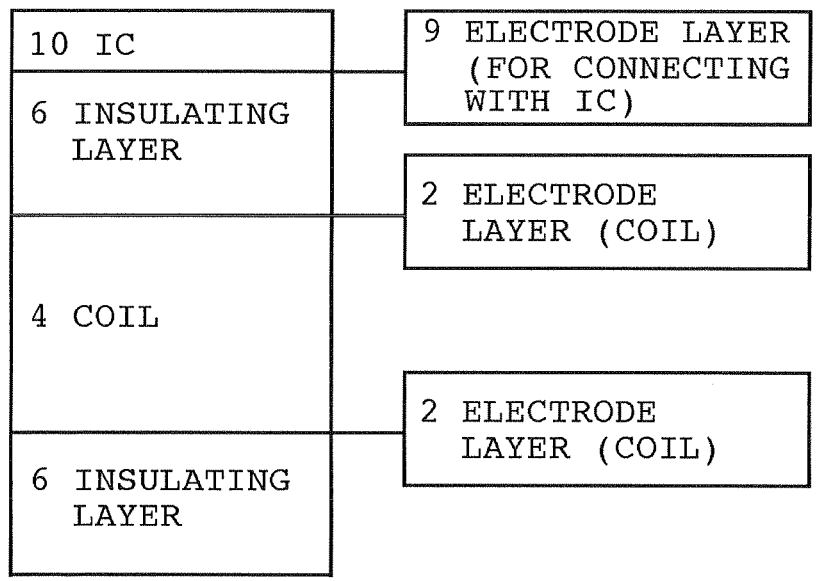
FIG. 7 is a conceptual view showing a laminated structure of a magnetic antenna according to the present invention.

Also, in the magnetic antenna of the present invention, as schematically shown in FIG. 7, a coil lead terminal and an IC chip connecting terminal (9) both formed of the electrode material may be formed on the surface of the insulating layer to mount an IC (10) thereon.

The magnetic antenna provided therein with the above IC chip connecting terminal may be produced as follows. That is, though-holes (1) are formed through the insulating layer (6) formed on at least one surface of the coil (4) on which the electrode layer is provided. The electrode material is poured into the through-holes (1), and connected with both ends of the coil (4) to thereby form the coil lead terminal and the IC chip connecting terminal both formed of the electrode material on the surface of the insulating layer. The thus produced structure is then integrally sintered to produce the magnetic antenna.

In addition, in the magnetic antenna of the present invention, an insulating layer may be formed on an outside surface of the conductive layer. Further, the thus formed insulating layer may be provided on an outside surface thereof with an additional magnetic layer or insulating layer.

With such a construction, the magnetic antenna of the present invention exhibits a less change in properties even when metallic objects come close thereto and, therefore, has a less change in resonance frequency.

Figure 8:
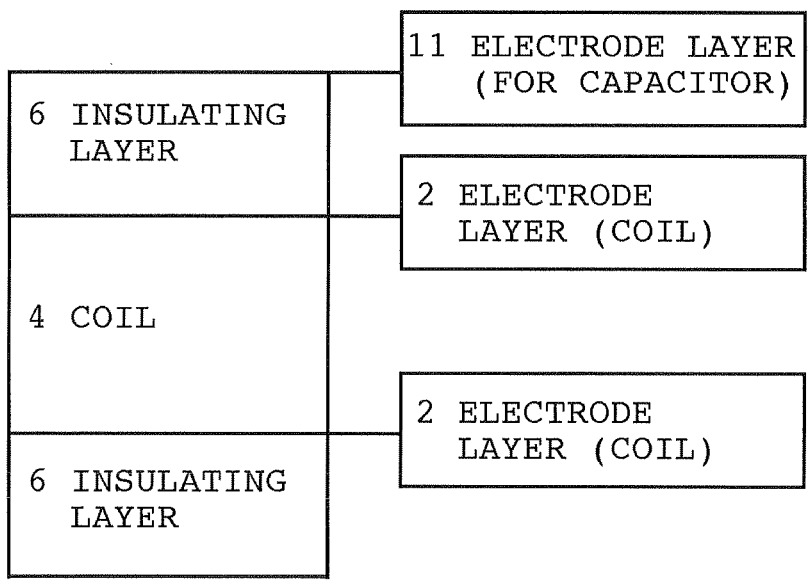
FIG. 8 shows a conceptual view showing a laminated structure of a magnetic antenna according to the present invention.

Further, in the magnetic antenna of the present invention, as schematically shown in FIG. 8, a capacitor electrode (11) may be disposed on at least one outer surface of the respective insulating layers (6) between which the coil (4) is sandwiched to contact upper and lower surfaces thereof with the insulating layers.

Figure 9:
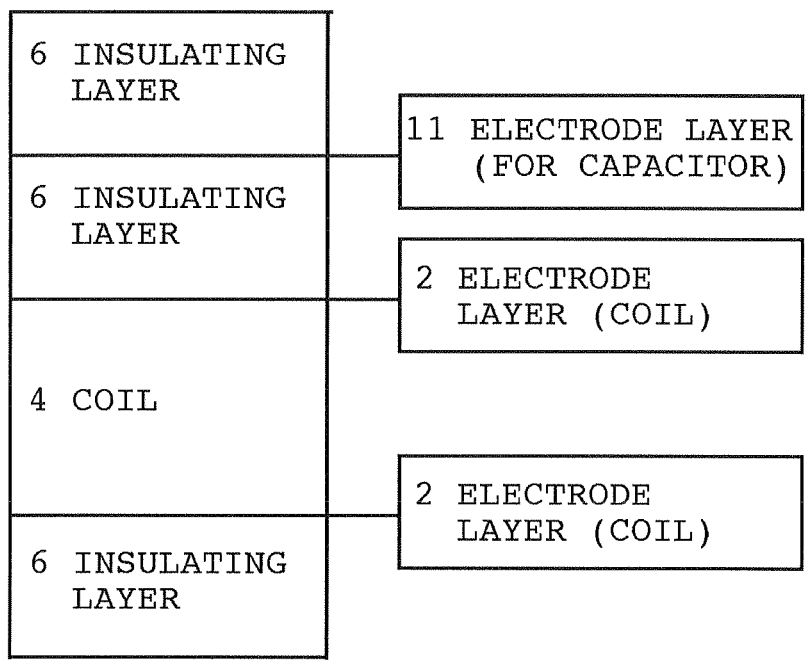
FIG. 9 shows a conceptual view showing a laminated structure of a magnetic antenna according to the present invention.

Meanwhile, the magnetic antenna of the present invention as schematically shown in FIG. 8 or FIG. 9 may have a parallel electrode or an interdigital electrode printed on an upper surface of the insulating layer to form a capacitor. In addition, the capacitor may be connected in parallel or in series to the coil lead terminal.

Figure 10:
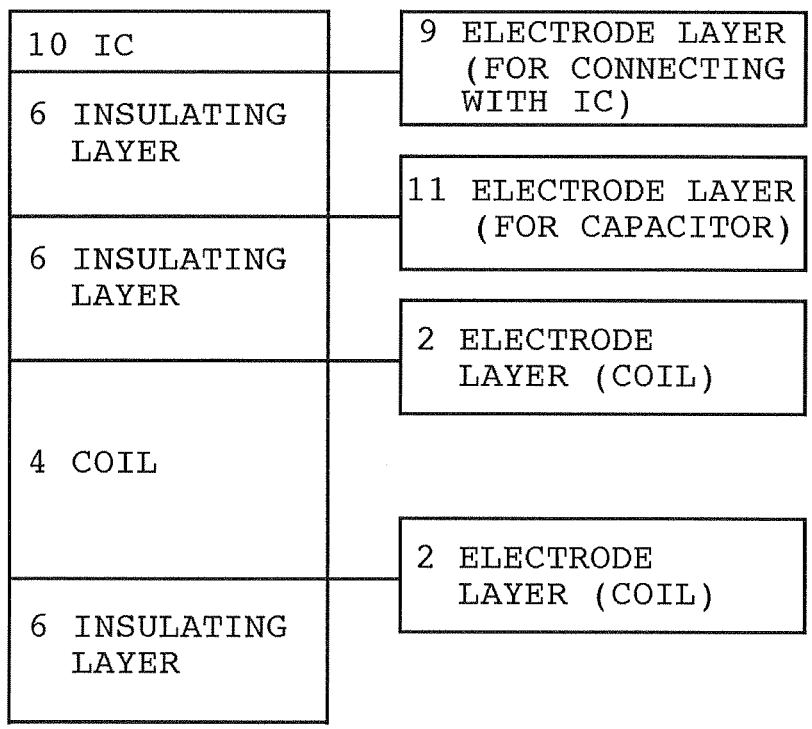
FIG. 10 shows a conceptual view showing a laminated structure of a magnetic antenna according to the present invention.

Further, as schematically shown in FIG. 10, the insulating layer may be provided on its outside surface where the capacitor electrode (11) is provided, with an additional insulting layer (6). Further, an electrode layer (11) which also serves as an IC chip connecting terminal may be further formed on an outside surface of the thus formed insulating layer (6) such that the insulating layer (6) is sandwiched therebetween, to form a capacitor which may be connected in parallel or in series to the IC chip terminal.

In addition, the magnetic antenna of the present invention may have a parallel electrode or an interdigital electrode printed on an upper surface of the insulating layer (6) to form a capacitor which may be connected in parallel or in series to the coil lead terminal.

Also, as shown in FIG. 7, the magnetic antenna of the present invention may be provided on an upper surface of the insulating layer (6), with such a terminal structure connectable with an IC chip (10). After connecting the IC chip connecting terminal and the coil lead terminal in parallel or in series to each other, the resulting structure may be integrally sintered to produce the magnetic antenna.

Also, the magnetic antenna of the present invention may be provided on an upper surface of the insulating layer with a terminal for proving a variable capacitor to connect both the coil lead terminals in parallel or in series to each other.

In the magnetic antenna of the present invention, the total thickness of the magnetic layers divided by the respective non-magnetic layers which constitute the core of the coil is preferably 0.1 to 5.0 mm. The thickness of one of the insulating layers is preferably 0.01 to 0.2 mm. Also, in the magnetic antenna of the present invention, the ratio of the thickness of the magnetic layers divided by the respective non-magnetic layers which constitute the core of the coil to the thickness of the insulating layer (magnetic layers/one of insulating layers) is preferably 0.5 to 500.

Meanwhile, in the magnetic antenna of the present invention, the coil comprising the magnetic layers divided by the respective non-magnetic layers and the electrode layers is provided on an outside thereof with additional magnetic layer and insulating layer. In this case, the thickness of the respective additional layers is preferably 0.05 to 0.5 mm.

The conductive layer may be formed by any suitable method, for example, by an ordinary method such as printing and brush coating. Alternatively, a metal plate may be attached to an outside of the insulating layer to thereby attain the same effect as the conductive layer.

As a material for forming the conductive layer or the electrode material to be poured into the through-holes, there may be suitably used an Ag paste as well as Ag-based alloy pastes and metal-based conductive pastes.

The thickness of the conductive layer (7) to be formed on an outside of the insulating layer is preferably 0.001 to 0.1 mm.

Figure 12:
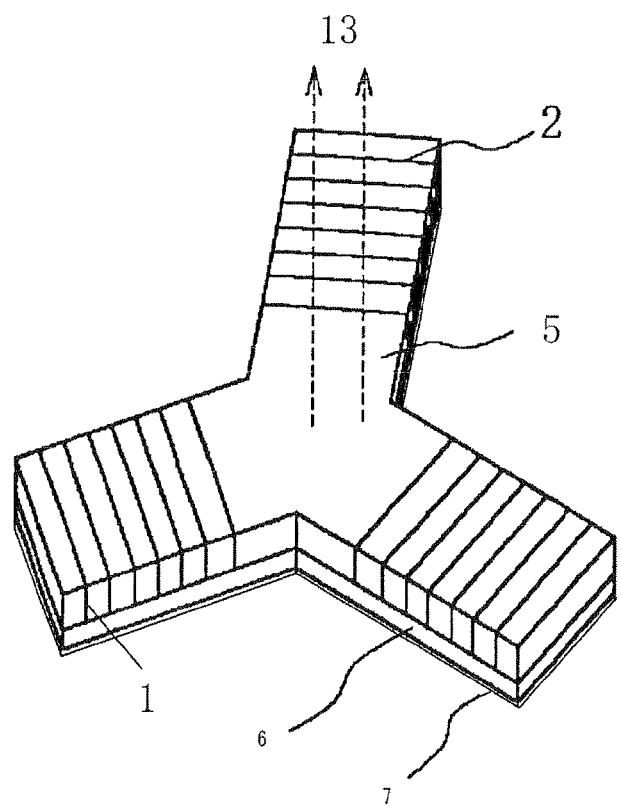
FIG. 12 is a conceptual view showing another embodiment of a magnetic antenna according to the present invention.

As shown in FIG. 12, the magnetic antenna of the present invention may be such a magnetic antenna for transmitting and receiving a magnetic field component in which a plurality of the coils each comprising the magnetic layers divided by the respective non-magnetic layers and each having a square shape or a rectangular shape are arranged substantially in a plane and extend radially at substantially equal angular intervals in an axial direction of the respective coils, and one ends of all of the coils facing to one another are connected together through their magnetic layers at a central portion of the radial arrangement toward which the respective coils extend radially, whereas the other ends of the coils extending outwardly are open ends, and further the ends of the respective coils facing to one another are connected in series or in parallel to one another to have the same polarity. In addition, the magnetic antenna may have such a structure in which the coils arranged in a plane are provided on one or both of the upper and lower surfaces thereof with an insulating layer or layers, and further, if required, one of the insulating layers may be provided on an outside surface thereof with a conductive layer.

Figure 13:
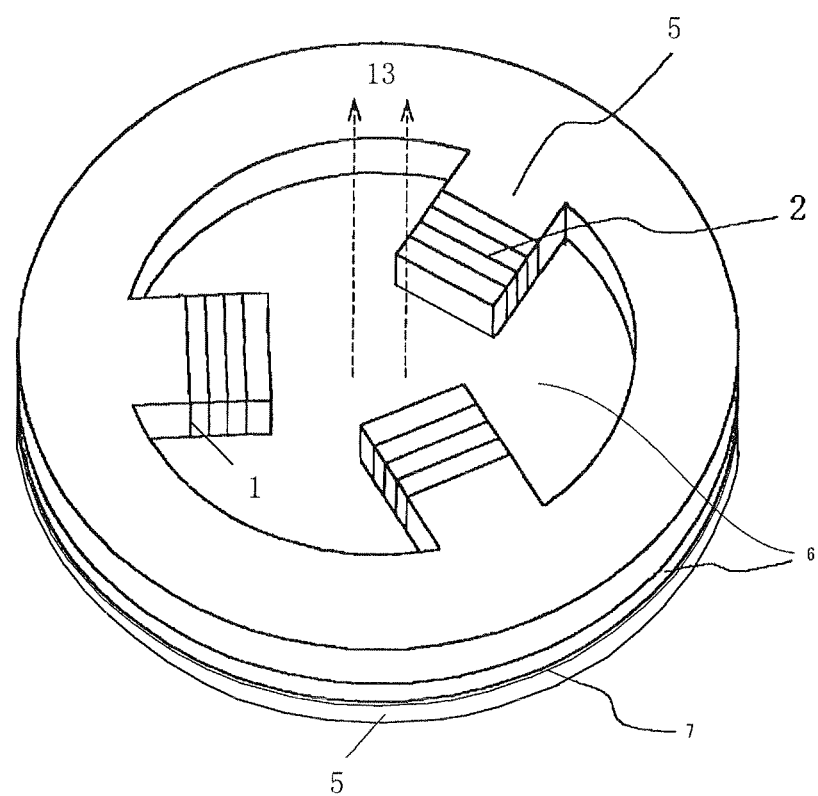
FIG. 13 is a conceptual view showing the other embodiment of a magnetic antenna according to the present invention.

As shown in FIG. 13, the magnetic antenna of the present invention may be such a magnetic antenna for transmitting and receiving a magnetic field component in which a plurality of the coils each comprising the magnetic layers divided by the respective non-magnetic layers and each having a square shape or a rectangular shape are arranged substantially in a plane and extend radially at substantially equal angular intervals in an axial direction of the respective coils, and one ends of all of the coils facing to one another are connected together through their magnetic layers at an outer periphery thereof toward which the respective coils extend radially, whereas the other ends of the coils facing inwardly to one another are open ends, and further the ends of the respective coils facing to one another are connected in series or in parallel to one another to have the same polarity. In addition, the magnetic antenna may have such a structure in which the coils arranged in a plane are provided on one or both of the upper and lower surfaces thereof with an insulating layer or layers, and further, if required, one of the insulating layers may be provided on an outside surface thereof with a conductive layer.

Figure 11:
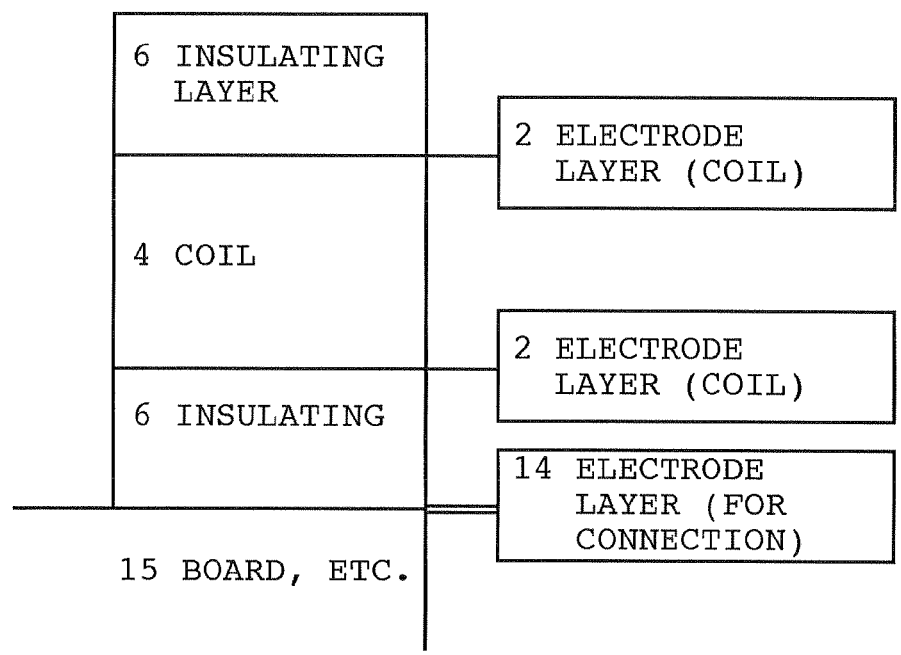
FIG. 11 is a conceptual view showing a board on which a magnetic antenna according to the present invention is mounted.

As schematically shown in FIG. 11, in the magnetic antenna of the present invention, the insulating layer (6) formed on a lower surface of the coil (4) may be provided therethrough with through-holes into which the electrode material is poured to connect with both the ends of the coil, and further a board connecting terminal (14) may be formed on the lower surface of the insulating layer, followed by integrally sintering the thus obtained structure. In this case, the resulting magnetic antenna may be readily bonded to a board formed of ceramic materials, resins, etc. Meanwhile, as the board, there may be used those boards formed of a composite material of the above various materials, a metal-containing material, etc.

In addition, the board on which the magnetic antenna of the present invention is mounted is characterized in that the magnetic antenna is fixed on a surface of the board (15) by a bonding agent, an adhesive or soldering. In the present invention, the magnetic antenna is mounted together with the other parts at the same time by the methods generally used for mounting various parts onto a multi-layer wiring board. Therefore, the board on which the magnetic antenna according to the present invention is mounted can be mass-produced with a high productivity.

In the multi-layer wiring board, wirings formed of a conductive material are disposed thereon, and have the same adverse influence on the magnetic antenna as that given by metals. However, the board on which the magnetic antenna according to the present invention is mounted has the above-mentioned structure, and is therefore free from adverse influence by metals. Even when any wirings formed of a conductive material are provided inside or on a surface of the multi-layer wiring board, etc., the magnetic antenna can be prevented from suffering from any adverse influence by the wirings.

IC may be connected with an IC chip connecting terminal formed on the insulating layer provided on an upper surface of the magnetic antenna as shown in FIG. 11. Alternatively, as also shown in FIG. 11, the IC may be connected with the board connecting terminal (14) through wirings provided inside of the board. Further, the magnetic antenna may be connected with a reader/writer through the inside board wirings connected to the board connecting terminal (14) formed on the lower surface thereof to use the magnetic antenna for the reader/writer.

Also, the magnetic antenna of the present invention or an RF tag comprising the magnetic antenna on which IC is mounted may be covered with a resin in order to enhance a strength thereof.

In addition, the magnetic antenna of the present invention may be installed in a communication device.

Further, the magnetic antenna of the present invention may be installed in a packaging container.

Furthermore, the magnetic antenna of the present invention may be fitted to metal parts such as tools and bolts.

<Function>

In the magnetic antenna of the present invention, since the magnetic material of the core is divided into parts by the non-magnetic material, it is possible to suppress deterioration in an effective magnetic permeability thereof owing to occurrence of a demagnetizing field, i.e., deterioration in a communication sensitivity. In addition, since the proportion of the non-magnetic material in the magnetic antenna is reduced to as small a level as possible, it is also possible to minimize deterioration in a communication sensitivity thereof which will be caused by reduction in proportion of the magnetic material in the magnetic antenna.

EXAMPLES

In the followings, the present invention is described in more detail on the basis of preferred embodiments thereof by referring to the accompanying drawings.

[Magnetic Antenna 1]

In order to form a magnetic layer (5), 100 parts by weight of calcined Ni—Zn—Cu ferrite particles which had been found to have a magnetic permeability of 13.56 MHz upon sintering at 900° C. ($Fe_2O_3$: 48.5 mol %; NiO: 25 mol %; ZnO: 16 mol %; CuO: 10.5 mol %), 8 parts by weight of a butyral resin, 5 parts by weight of a plasticizer, and 80 parts by weight of a solvent were mixed in a ball mill to prepare a slurry. The resulting slurry was applied on a PET film with a size of 150 mm ×150 mm by a doctor blade such that the thickness of the coating layer obtained after sintering was 0.1 mm, thereby obtaining a sheet.

In order to form a non-magnetic layer (8), 100 parts by weight of a borosilicate glass ($SiO_2$: 86 to 89% by weight; $B_2O_3$: 7 to 10% by weight; $K_2O$: 0.5 to 7% by weight), 8 parts by weight of a butyral resin, 5 parts by weight of a plasticizer, and 80 parts by weight of a solvent were mixed in a ball mill to prepare a slurry. The resulting slurry was applied on a PET film with a size of 150 mm×150 mm by a doctor blade such that the thickness of the coating layer obtained after sintering was 0.05 mm, thereby obtaining a sheet.

In order to form an insulating layer (6), 100 parts by weight of calcined Zn—Cu ferrite particles ($Fe_2O_3$: 48.5 mol %; ZnO: 41 mol %; CuO: 10.5 mol %), 8 parts by weight of a butyral resin, 5 parts by weight of a plasticizer, and 80 parts by weight of a solvent were mixed in a ball mill to prepare a slurry. The resulting slurry was applied on a PET film with the same size and thickness as the sheet for the magnetic layer, thereby obtaining a sheet.

Next, as shown in FIG. 4, two sheets each prepared by laminating one green sheet for the magnetic layer (5) and one green sheet for the non-magnetic layer (8) were pressed and bonded together to form one laminated sheet, and through-holes (1) were formed therethrough and filled with an Ag paste. Then, an Ag paste was printed on both surfaces of the laminated sheet which are perpendicular to the through-holes (1). The ten laminated sheets prepared above were laminated on one another to form the coil (4).

Next, as shown in FIG. 2, green sheets for the insulating layer (6) were laminated on upper and lower surfaces of the coil (4). In this case, on one of the upper and lower surfaces of the coil, the green sheet for the insulating layer (6) on which a conductive layer (7) was formed by printing an Ag paste thereon was laminated.

The thus laminated green sheets were bonded together by applying a pressure thereto. The resulting laminate was cut along the lines passing through the through-holes and the coil open ends 3, and integrally sintered at 900° C. for 2 hr, thereby obtaining a magnetic antenna sample 1 with a size of 10 mm in width×3 mm in length having a coil winding number of 23 turns (in FIGS. 1 and 4, the coil is shown as having only seven turns, and the magnetic layers are shown as being formed of only three layers, for the sake of simplicity, which also applies to the other drawings).

Probes were connected to both ends of the coil of the magnetic antenna to measure an inductance ($L_1$) thereof at a frequency of 1 MHz. The ratio of the thus measured inductance ($L_1$) to an inductance ($L_0$) of an air core coil having the same shape as that of the core coil ($L_1/L_0$) was measured as an effective magnetic permeability of the magnetic antenna.

Further, an IC for an RF tag was connected to both ends of the coil of the magnetic antenna, and a capacitor was connected in parallel to the IC. Then, the resonance frequency was adjusted to 13.56 MHz, thereby obtaining an RF tag. The thus obtained RF tag was attached to a metal plate, and its communication distance, i.e., the distance over which it was able to communicate with a reader/writer having an output of 100 mW, was measured. The measuring methods are described below.

[Methods for Measuring and Adjusting Resonance Frequency]

The resonance frequency was measured by the following method. That is, a one-turn coil was connected to an impedance analyzer "4291A" manufactured by Agilent Technology Co., Ltd., which was in turn coupled with the RF tag. The peak frequency of the measured impedance was determined as the resonance frequency.

[Method for Measuring Communication Distance]

The communication distance was measured by the following method. That is, the antenna of a reader/writer having an output of 100 mW (product name "TR3-A201/TR3-D002A" manufactured by Takaya Co., Ltd.) was fixed horizontally, and the RF tag was placed above the antenna such that the length direction of the RF tag was perpendicular to the antenna. Then, the RF tag was moved within the range in which it was able to communicate at 13.56 MHz, and the maximum distance in the vertical direction between the antenna and the RF tag was determined as the communication distance.

[Magnetic Antenna 2]

A glass ceramic paste was printed on the green sheet for the magnetic layer (5) produced in the same manner as defined in Magnetic antenna 1 such that the thickness of the resulting coating layer was 0.02 mm. The thus obtained sheets were laminated on one another to obtain a laminated sheet having 10 magnetic layers.

Then, through-holes (1) were formed through the laminated sheet comprising the green sheets for the magnetic layers (5) and filled with an Ag paste. Then, an Ag paste was printed and laminated on both surfaces of the laminated sheet which are perpendicular to the through-holes (1) to form the coil (4).

Next, the green sheet for the insulating layer (6) on which the conductive layer (7) was formed by printing an Ag paste thereon was laminated on one surface of the coil (4). The other surface of the coil was laminated with the green sheet for the insulating layer (6) through which through-holes were formed to connect with both ends of the coil and filled with an Ag paste and which was formed on its surface layer perpendicular to the through-holes (1) with a coil lead terminal and an IC chip connecting terminal (9) by printing an Ag paste into shapes of these terminals thereon. The thus laminated green sheets were bonded together by applying a pressure thereto. The resulting laminate was cut along the lines passing through the through-holes (1) and the coil open ends (3), and integrally sintered at 900° C. for 2 hr, thereby obtaining a magnetic antenna sample 3 with a size of 10 mm in width×3 mm in length having a coil winding number of 23 turns.

Probes were connected to both ends of the coil of the magnetic antenna to measure an inductance ($L_1$) thereof at a frequency of 1 MHz. The ratio of the thus measured inductance ($L_1$) to an inductance ($L_0$) of an air core coil having the same shape as that of the core coil ($L_1/L_0$) was measured as an effective magnetic permeability of the magnetic antenna.

Then, an IC for an RFID tag was connected to both ends of the coil of the magnetic antenna, and a capacitor was connected in parallel to the IC. Then, the resonance frequency was adjusted to 13.56 MHz, thereby obtaining an RF tag. The thus obtained RF tag was attached to a metal plate, and its communication distance, i.e., the distance over which it was able to communicate with a reader/writer having an output of 100 mW, as well as the resonance frequency thereof, were measured.

[Magnetic antenna 3] <Embodiment Shown in FIG. 3(b)>

The green sheet for the magnetic layer (5) and the glass ceramic green sheet for the non-magnetic layer (8) were respectively produced in the same manner as defined in Magnetic antenna 1, so as to each have the same thickness of 0.1 mm. The thus obtained green sheets were respectively cut into a width of 0.1 mm using a cutting machine for ceramic green sheet laminates ("G-CUT" manufactured by UHT Co., Ltd.). Then, the cut green sheets were alternately placed side by side in the order of the magnetic layer and the non-magnetic layer in the form of one sheet, and then pressed and bonded together. The ten sheets thus obtained were staked on one another in the vertical direction such that the magnetic layers and the non-magnetic layers were also alternately arranged in the vertical direction, thereby preparing a laminated sheet to be ready for pressing and bonding. Then, as shown in FIG. 4, through-holes (1) were formed through each green sheet and filled with an Ag paste, and further an Ag paste was printed on both surfaces of the laminated sheet which were perpendicular to the through-holes (1). The ten green sheets were laminated on one another, thereby obtaining the coil (4).

The thus obtained coil was provided thereon with the insulating layer in the same manner as defined in Magnetic antenna 1, thereby obtaining a magnetic antenna.

[Magnetic antenna 4] <Embodiment Shown in FIG. 3(c)>

The green sheet for the magnetic layer (5) and the glass ceramic green sheet for the non-magnetic layer (8) were respectively produced in the same manner as defined in Magnetic antenna 1, such that the thickness of the green sheet for the magnetic layer (5) was 0.1 mm and the thickness of the glass ceramic green sheet for the non-magnetic layer (8) was 0.05 mm. The thus obtained green sheets were respectively cut into a width of 0.1 mm using a cutting machine for ceramic green sheet laminates ("G-CUT" manufactured by UHT Co., Ltd.). Then, the cut green sheets were alternately placed side by side in the order of the magnetic layer and the non-magnetic layer in the form of one sheet, and then pressed and bonded together. The ten thus obtained sheets and the ten glass ceramic green sheets were alternately staked on one another, thereby preparing a laminated sheet to be ready for pressing and bonding. Then, as shown in FIG. 4, through-holes (1) were formed through each green sheet and filled with an Ag paste, and further an Ag paste was printed on both surfaces of the laminated sheet which were perpendicular to the through-holes (1). The ten green sheets were laminated on one another, thereby obtaining the coil (4).

The thus obtained coil was provided thereon with the insulating layer in the same manner as defined in Magnetic antenna 1, thereby obtaining a magnetic antenna.

[Magnetic antenna 5] <Embodiment shown in FIG. 3(d)>

The slurry produced in the same manner as defined in Magnetic antenna 1, was used for producing a magnetic bar for the magnetic layer (5). The thus produced magnetic bars were arranged in a container, and then a slurry of a non-magnetic glass ceramic material was poured into the container to thereby a sheet having a thickness of 1 mm. The thus obtained sheets and the glass ceramic green sheets were alternately staked on one another in total 10 sheets in the vertical direction, thereby preparing a laminated sheet to be ready for pressing and bonding. Then, as shown in FIG. 4, through-holes (1) were formed through each green sheet and filled with an Ag paste, and further an Ag paste was printed on both surfaces of the laminated sheet which were perpendicular to the through-holes (1). The ten green sheets thus stacked were laminated on one another, thereby obtaining the coil (4).

The thus obtained coil was provided thereon with the insulating layer in the same manner as defined in Magnetic antenna 1, thereby obtaining a magnetic antenna.

[Magnetic antenna 6: Comparative Example]

The ten green sheets for the magnetic layer (5) produced in the same manner as defined in Magnetic antenna 1 were laminated as such on one another. As a result, it was confirmed that the resulting magnetic antenna had an effective magnetic permeability of 10.5, and the communication distance of the antenna with a reader/writer having an output of 100 mW, was 6.0 cm.

TABLE 1

| Examples and Comparative Examples | Effective magnetic permeability $L_1/L_0$ (MHz) | Communication distance | | Ratio between sectional areas of non-magnetic layer and magnetic layer within core (non-magnetic layer/magnetic layer) |
| --- | --- | --- | --- | --- |
| | | Before attached to metal plate (cm) | After attached to metal plate (cm) | |
| Antenna 1 | 31.5 | 8.4 | 7.1 | 0.5 |
| Antenna 2 | 32.2 | 8.3 | 6.9 | 0.2 |
| Antenna 3 | 24.6 | 7.5 | 6.4 | 1.0 |
| Antenna 4 | 52.5 | 10.2 | 8.7 | 0.9 |
| Antenna 5 | 52.5 | 10.2 | 8.7 | 0.8 |

TABLE 1-continued

| Examples and Comparative Examples | Effective magnetic permeability $L_1/L_0$ (MHz) | Communication distance | | Ratio between sectional areas of non-magnetic layer and magnetic layer within core (non-magnetic layer/magnetic layer) |
|---|---|---|---|---|
| | | Before attached to metal plate (cm) | After attached to metal plate (cm) | |
| Antenna 6 (Comparative Example) | 10.5 | 6.0 | 5.1 | — |

Thus, it was recognized that all of the magnetic antennas according to the present invention had a high effective magnetic permeability, and were capable of satisfying both reduction in size and improvement in communication sensitivity.

The invention claimed is:

1. A magnetic antenna for transmitting and receiving information using an electromagnetic induction method, comprising a central core formed of a magnetic material and a non-magnetic material, a coil-shaped electrode material disposed outside of and wound around the magnetic material and the non-magnetic material of the central core, and an insulating layer formed on at least one outside surface of the core on which the coil-shaped electrode material is provided, in which the magnetic material is separated into two or more parts through the non-magnetic material when viewed in a section of the core which is perpendicular to a magnetic flux passing therethrough, wherein the coil-shaped electrode material is oriented relative to the magnetic material and the non-magnetic material such that each coil of the electrode material is concurrently wound around both the magnetic material and the non-magnetic material.

2. A magnetic antenna according to claim 1, wherein the non-magnetic material is formed of a non-magnetic ferrite and/or a glass-based ceramic material.

3. A magnetic antenna according to claim 1, wherein the core is formed by laminating the magnetic material and the non-magnetic material.

4. A magnetic antenna according to claim 1, wherein the magnetic material and the non-magnetic material are formed into a lattice structure when viewed in a section of the core.

5. A magnetic antenna according to claim 1, wherein the non-magnetic material is disposed outside of each of a plurality of circular portions formed of the magnetic material when viewed in a section of the core.

6. A magnetic antenna according to claim 1, wherein an area ratio of all portions of the magnetic material to all portions of the non-magnetic material is not more than 1.0 when viewed in a section of the core.

7. A board comprising the magnetic antenna as defined in claim 1, which is mounted thereon.

8. A communication device comprising the magnetic antenna as defined in claim 1, which is mounted thereon.

9. An RF tag comprising the magnetic antenna as defined in claim 1, which is mounted together with IC thereon.

10. A magnetic antenna for transmitting and receiving information using an electromagnetic induction method, comprising a central core formed of a magnetic material and a non-magnetic material, a coil-shaped electrode material disposed outside of and wound around the magnetic material and the non-magnetic material of the central core, an insulating layer formed on at least one outside surface of the core on which the coil-shaped electrode material is provided, or along an outer periphery of the core, and a conductive layer formed on at least one outside surface of the insulating layer, in which the magnetic material is separated into two or more parts through the non-magnetic material when viewed in a section of the core which is perpendicular to a magnetic flux passing therethrough, wherein the coil-shaped electrode material is oriented relative to the magnetic material and the non-magnetic material such that each coil of the electrode material is concurrently wound around both the magnetic material and the non-magnetic material.

11. A magnetic antenna according to claim 10, wherein the non-magnetic material is formed of a non-magnetic ferrite and/or a glass-based ceramic material.

12. A magnetic antenna according to claim 10, wherein the core is formed by laminating the magnetic material and the non-magnetic material.

13. A magnetic antenna according to claim 10, wherein the magnetic material and the non-magnetic material are formed into a lattice structure when viewed in a section of the core.

14. A magnetic antenna according to claim 10, wherein the non-magnetic material is disposed outside of each of a plurality of circular portions formed of the magnetic material when viewed in a section of the core.

15. A magnetic antenna according to claim 10, wherein an area ratio of all portions of the magnetic material to all portions of the non-magnetic material is not more than 1.0 when viewed in a section of the core.

16. A board comprising the magnetic antenna as defined in claim 10 which is mounted thereon.

17. A communication device comprising the magnetic antenna as defined in claim 10 which is mounted thereon.

18. An RF tag comprising the magnetic antenna as defined in claim 10 which is mounted together with IC thereon.

* * * * *